United States Patent
Wiseman et al.

(10) Patent No.: US 7,139,066 B2
(45) Date of Patent: *Nov. 21, 2006

(54) RETICLE CARRIER INCLUDING RETICLE POSITIONING AND LOCATION MEANS

(75) Inventors: Brian Wiseman, Glencoe, MN (US); Justin Strike, Maple Grove, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/999,371

(22) Filed: Nov. 30, 2004

(65) Prior Publication Data
US 2005/0134831 A1    Jun. 23, 2005

Related U.S. Application Data

(63) Continuation of application No. 10/190,347, filed on Jul. 5, 2002, now Pat. No. 6,825,916.

(51) Int. Cl.
*G03B 27/62* (2006.01)
*G03B 27/64* (2006.01)
*G03B 27/58* (2006.01)

(52) U.S. Cl. ............... 355/75; 355/76; 355/72

(58) Field of Classification Search ............ 355/75, 355/76, 72; 428/14; 206/710, 454
See application file for complete search history.

(56) References Cited

U.S. PATENT DOCUMENTS 6,216,873 B1 * 4/2001 Fosnight et al. ............ 206/710
6,825,916 B1 * 11/2004 Wiseman et al. ............ 355/75

* cited by examiner

*Primary Examiner*—Peter B. Kim
(74) *Attorney, Agent, or Firm*—Patterson, Thuente, Skaar & Christensen, P.A.

(57) ABSTRACT

A carrier for a reticle used in photolithographic semiconductor processing, having a base portion and a cover portion. The base portion has a plurality of reticle supports and a plurality of reticle positioning members. The cover portion is adapted to sealingly mate with the base portion, and has an inner surface with a plurality of spaced apart reticle restraints and a pair of reticle positioning tabs projecting inwardly therefrom. Each reticle positioning tab has a diagonal edge portion, and is oriented so that the diagonal edge portion urges a reticle resting on the reticle supports into engagement with the reticle restraints when the cover portion is mated with the base portion.

16 Claims, 5 Drawing Sheets

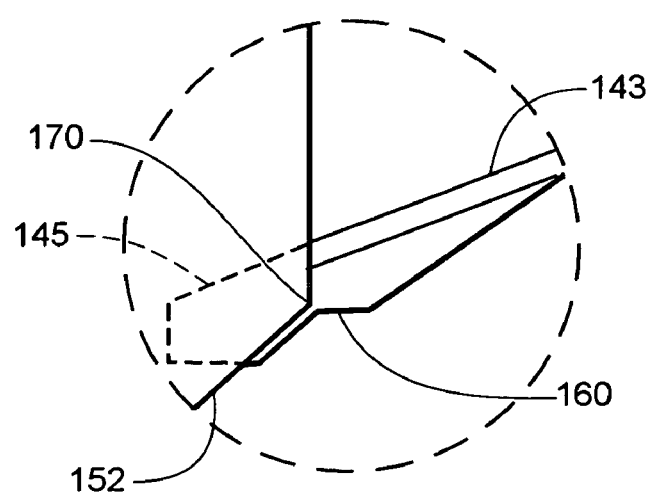

RETICLE CARRIER INCLUDING RETICLE POSITIONING AND LOCATION MEANS

This application is a continuation of 10/190,347 filed Jul. 5, 2002 and U.S. Pat. No. 6,825,916.

FIELD OF THE INVENTION

The invention relates to carriers for reticles used in photolithographic integrated circuit production, and more specifically to features for self-positioning of a reticle within a reticle carrier.

BACKGROUND OF THE INVENTION

Integrated circuit devices are commonly manufactured using a process known as photolithography. In photolithography, a photoresist layer is first deposited on a wafer substrate. Radiant energy, such as ultraviolet light, is then projected onto the photoresist layer through a template in the form of a mask or reticle having the desired pattern. The photoresist layer is then developed to remove either the exposed portions or the unexposed portions, to form a resist mask on the substrate. The resist mask can then be used to protect underlying areas during later deposition or etching processes.

An important component of the photolithographic apparatus is the reticle, which provides the pattern and layout corresponding to the various integrated circuit features. Typically, the reticle is a transparent glass plate with a layer of opaque or semi-opaque material coated thereon forming the pattern. It is critically important that the surfaces of the reticle, especially the coated surface, be protected from damage or contamination, since any such defects or contamination may be projected onto the photoresist layer during exposure, thus leading to a finished integrated circuit device of unacceptably diminished or even unusable quality.

Specialized carriers have been developed to protect a reticle from physical damage and contamination during storage and transport. These carriers typically comprise an enclosure having various reticle contact portions therein for supporting and restraining the reticle from movement. The reticle is usually manually positioned on support surfaces within the enclosure, and the reticle is then engaged and more closely restrained against movement by restraint members attached within the enclosure. These restraint members are typically designed to engage the reticle at its edges. A problem, however, has been that a person initially manually positioning the reticle on the support surfaces may fail to place the reticle in the proper position for engagement by the restraint members, or may inadvertently cause the reticle to be dislodged from its proper positioning before it is engaged by the restraint members. If the reticle is out of position a sufficient distance, the restraint members may then engage the reticle on its surfaces rather than at its edges, thereby causing scratching or other physical damage to the reticle.

What is needed is some type of structure or device for ensuring proper self positioning of a reticle within a reticle carrier to prevent damage during engagement by restraint members.

SUMMARY OF THE INVENTION

The present invention provides a means of properly positioning a reticle in a carrier for engagement by reticle restraints while minimizing the opportunities for surface damage to the reticle inflicted by the reticle restraints. Also, with the present invention, manual positioning of the reticle on the reticle supports may be less precise, allowing for a greater margin for error.

The present invention is a reticle carrier having features for self-positioning of the reticle. In a currently most preferred embodiment of the invention, the carrier has a base portion and a cover portion. The base portion has reticle supports along with positioning tabs to guide proper manual positioning of the reticle on three sides. The base portion has no positioning tabs on the fourth side of the reticle. The cover portion has downwardly projecting self-positioning tabs having diagonal edges positioned so as to be engageable with the fourth side of the reticle. These downwardly projecting self-positioning tabs are oriented so that when the cover portion is placed over the base portion and pressed downward into engagement, the diagonal edges of the self-positioning tabs will engage an upper corner on the fourth side of the reticle, if the reticle is not properly positioned. As the cover portion is moved further downward into engagement with the base portion, the reticle is urged into proper position by the diagonal edges of the self-positioning tabs.

Accordingly, the present invention may be characterized in one embodiment as a carrier for a reticle used in photolithographic semiconductor processing, having a base portion and a cover portion. The base portion has a plurality of reticle supports and a plurality of reticle positioning members. The cover portion is adapted to sealingly mate with the base portion, and has an inner surface with a plurality of spaced apart reticle restraints and a pair of reticle positioning tabs projecting inwardly therefrom. Each reticle positioning tab has a diagonal edge portion, and is oriented so that the diagonal edge portion urges a reticle resting on the reticle supports into engagement with the reticle restraints when the cover portion is mated with the base portion.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 10 is an enlarged view of a positioning tab and reticle restraint according to the present invention.

DETAILED DESCRIPTION OF THE PREFERRED EMBODIMENTS

The accompanying Figures depict embodiments of the reticle carrier of the present invention, and features and components thereof. Any references to front and back, right and left, top and bottom, upper and lower, and horizontal and vertical are intended for convenience of description, not to limit the present invention or its components to any one positional or spacial orientation. Any dimensions specified in the attached Figures and this specification may vary with a potential design and the intended use of an embodiment of the invention without departing from the scope of the invention.

In FIGS. 1–10, there is shown a preferred embodiment of the self-positioning reticle carrier 100 of the present invention. Reticle carrier 100 generally comprises an enclosure 101 formed by mating base portion 120 with cover portion 140.

Figure 1:
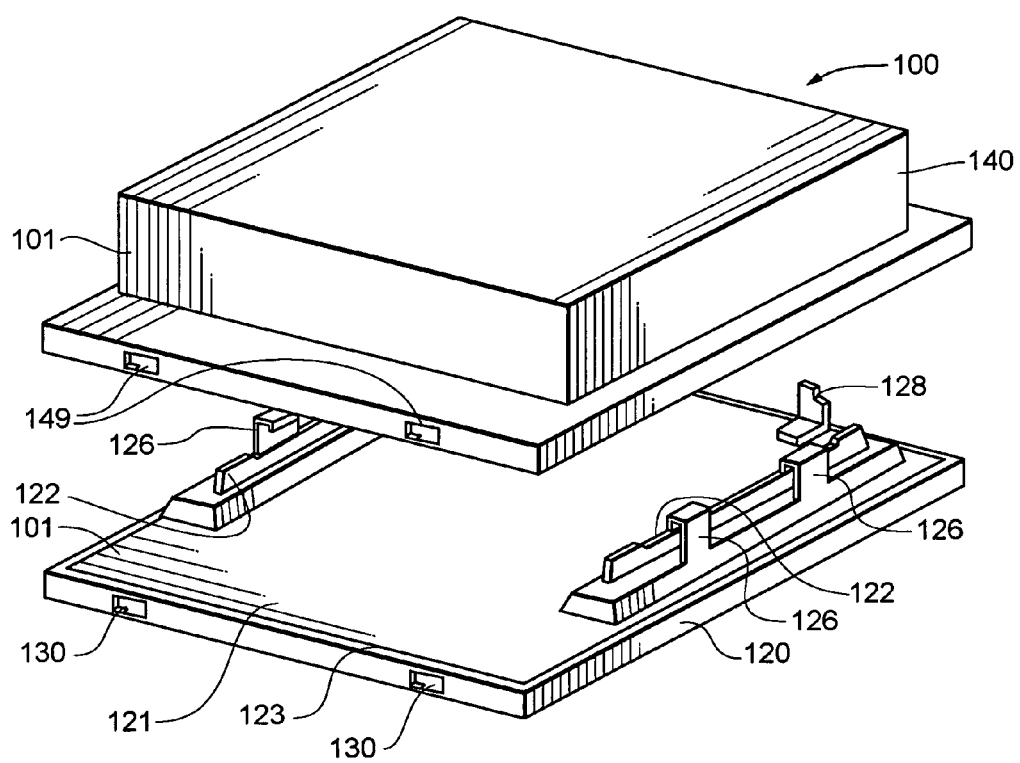
FIG. 1 is a perspective view of a reticle carrier according to a preferred embodiment of the present invention.
Figure 2:
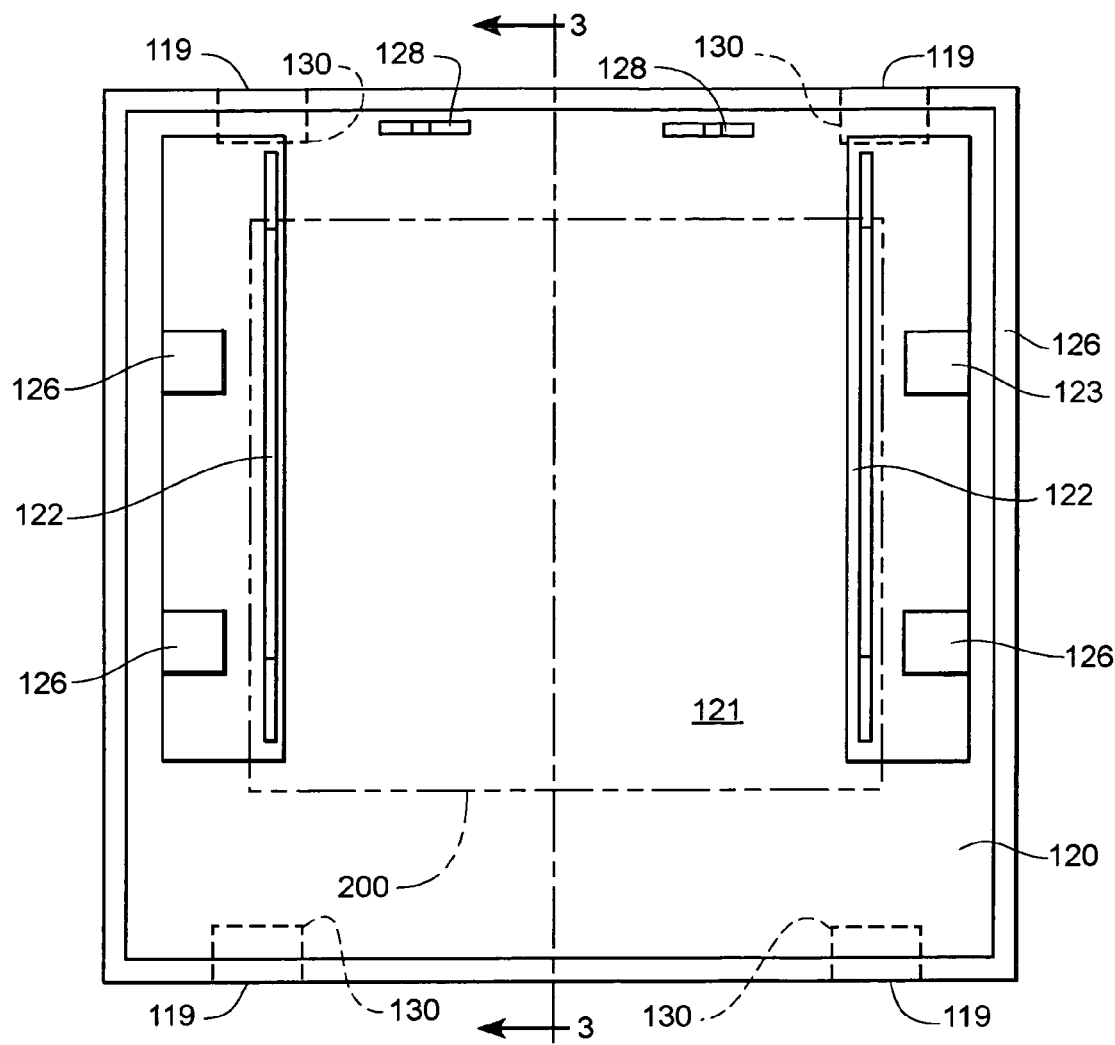
FIG. 2 is a top plan view of the base portion of the reticle carrier of FIG. 1.
Figure 3:
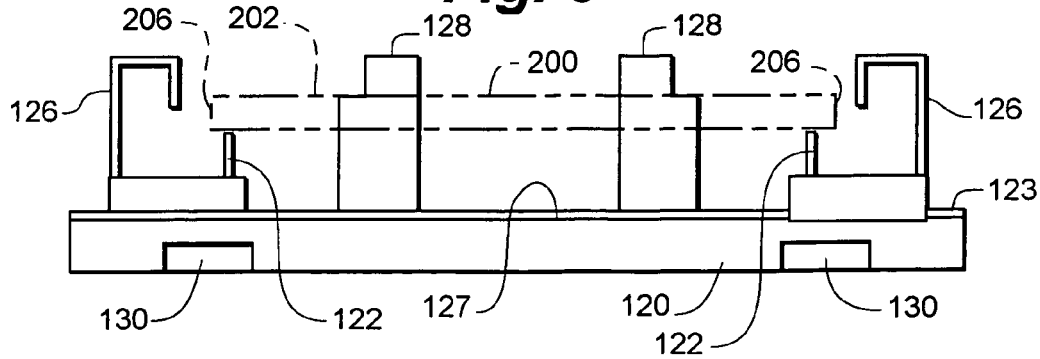
FIG. 3 is a sectional view of the base portion of the reticle carrier of FIG. 2.

Base portion 120, shown best in FIGS. 2 and 3, has reticle supports 122 projecting upwardly from planar backing portion 121. Reticle side positioning members 126 and back positioning members 128 are provided to guide manual positioning of a reticle and ensure proper lateral and rearward placement of the reticle on reticle supports 122. Gasket 123 is provided at the periphery of backing portion 121, and is positioned so as to sealingly engage mating surface 148 of cover portion 140.

Figure 4:
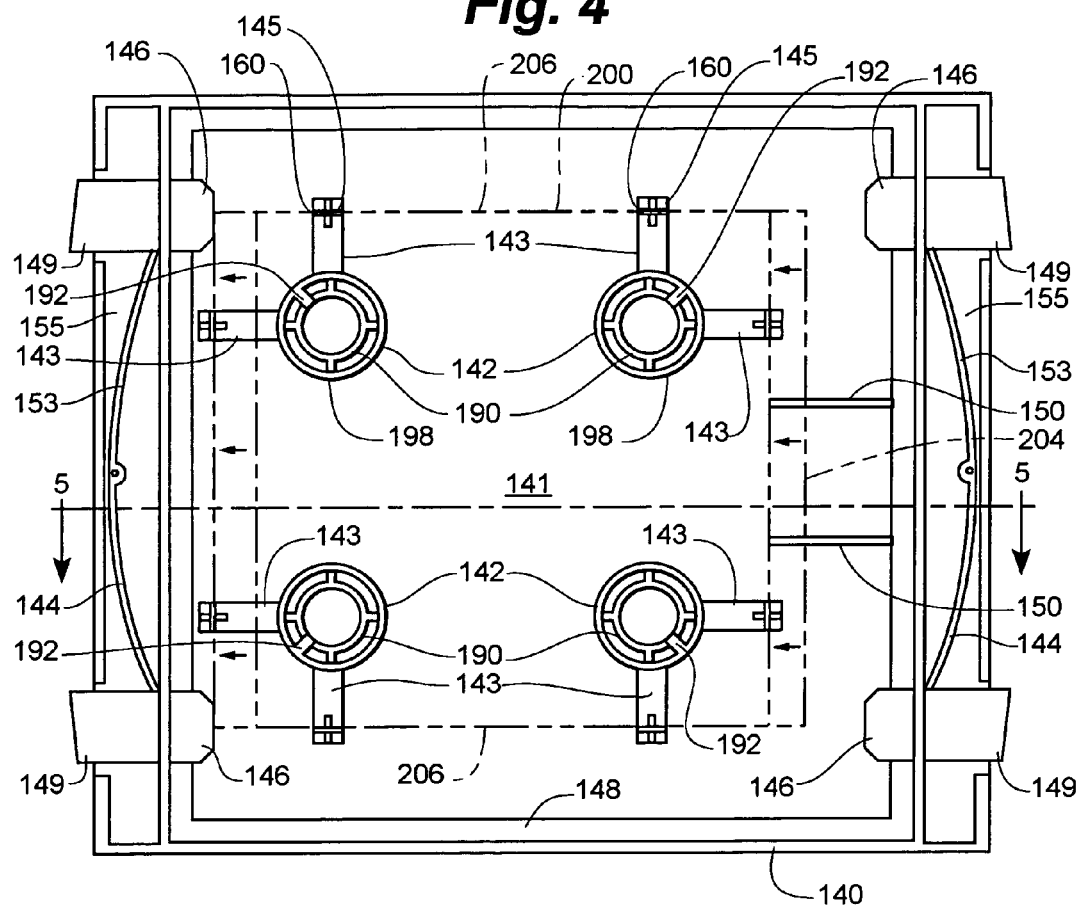
FIG. 4 is a plan view of the inside of the cover portion of the reticle carrier of FIG. 1.
Figure 5:
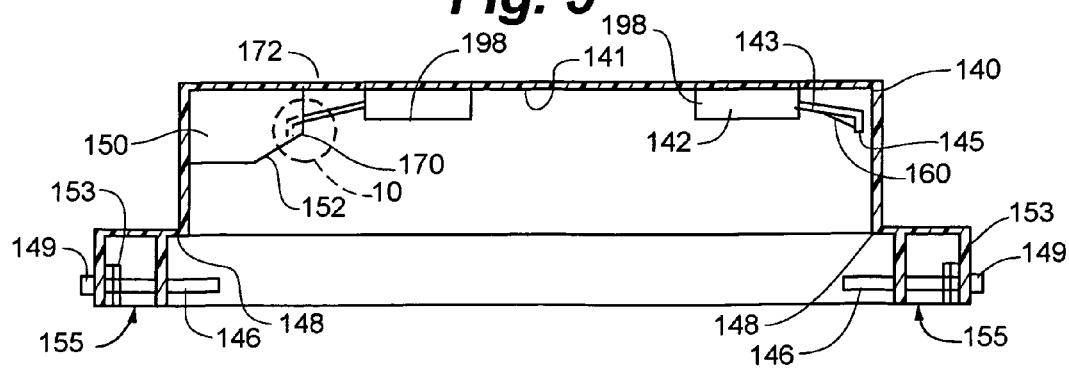
FIG. 5 is a sectional view of the cover portion of FIG. 4.

Cover portion 140, shown best in FIGS. 4 and 5, has reticle restraints 142 spaced apart on inner surface 141. Each reticle restraint 142 has a pair of resilient arms 143 which may be arranged in a right angle projecting from mounting ring 198. As shown best in FIG. 10, at the end of each resilient arm 143 is reticle engagement portion 145, which has notch 160 for engaging en upper corner of a reticle, as will be further described hereinbelow. Each mounting ring 198 is frictionally secured on a boss 190 projecting from inner surface 141. Tab 192 is provided to rotationally secure each reticle restraint 142. The position of reticle restraints 142 on inner surface 141 and the length of silent arms 143 may be concertedly selected so that each reticle engagement portion 145 engages and restrains an upper corner of a reticle 200 positioned on reticle supports 122. In addition, the geometry and location of reticle restraints 142 may be selected so that each reticle restraint is slightly deflected and thereby exerts a downwardly directed bias on reticle 200 when cover portion 140 is completely engaged with base portion 120. Latch portions 144 are provided at opposite sides of cover portion 140 to securely fasten cover portion 140 to base portion 120. Each latch portion 144 has a pair of inwardly projecting latch tabs 146 connected by resilient connector portion 153. Each latch tab 146 has a gripping portion 149, allowing the latch tab to be gasped and pulled outwardly, so that each latch tab may clear edge 119 of base portion 120 during installation of cover portion 140 on base portion 120. Latch tabs 146 are received by latch recesses 130 in base portion 120. Each latch portion 144 is disposed in a recess 155 in cover portion 140. Recess cover 156 is provided to retain latch portion 144 within recess 155.

The unique self-positioning feature of the present invention is provided in a currently most preferred embodiment by a pair of positioning tabs 150, which project inwardly from inner surface 141 of cover portion 140, as shown best in FIGS. 4 and 5. Each positioning tab 150 has a diagonally oriented edge portion 152, which is disposed so as to engage the upper corner 210 of a reticle resting on reticle supports 122, when cover portion 140 is engaged with base portion 120. Each diagonally oriented edge portion 152 meets a vertically oriented edge portion 172 at corner 170.

Figure 6:
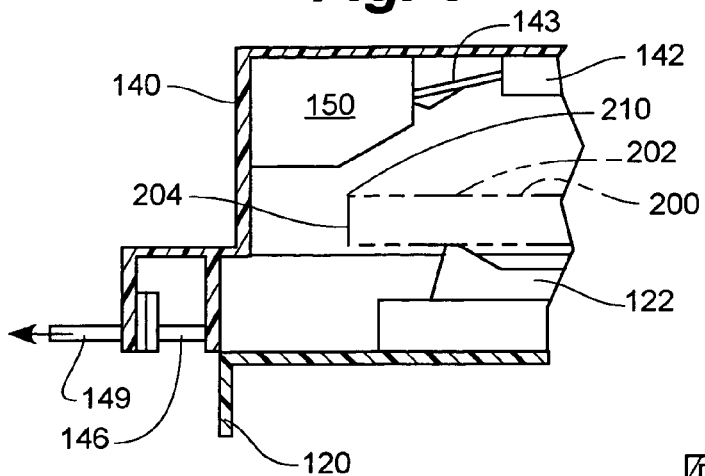
FIG. 6 is a partial sectional view showing the operation of the positioning tabs of a preferred embodiment of the present invention.
Figure 7:
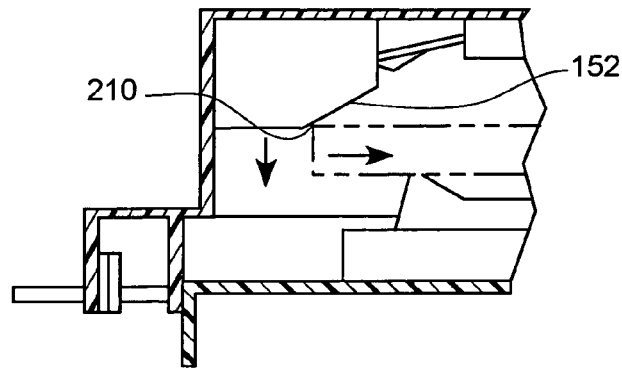
FIG. 7 is another partial sectional view showing the operation of the positioning tabs of a preferred embodiment of the present invention.
Figure 8:
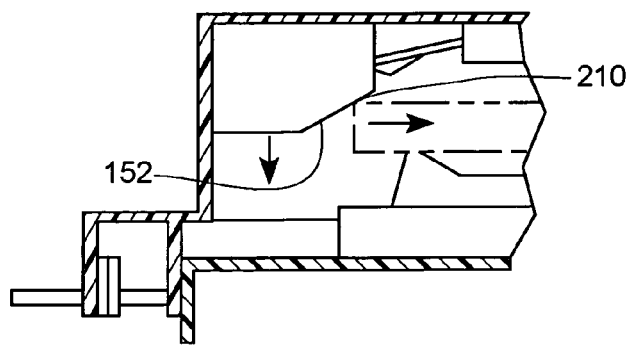
FIG. 8 is yet another partial sectional view showing the operation of the positioning tabs of a preferred embodiment of the present invention.
Figure 9:
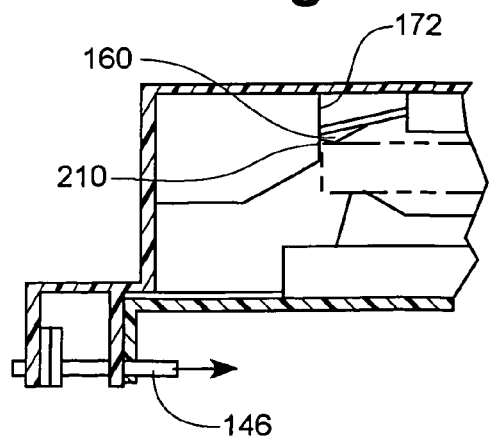
FIG. 9 is still another partial sectional view showing the operation of the positioning tabs of a preferred embodiment of the present invention.

The operation of the invention may now be understood with reference to FIGS. 2–9. Reticle 200 may be manually positioned on reticle supports 122. Side positioning tabs 126 guide the lateral placement of reticle 200 so that each corner 212 formed by upper reticle surface 202 and side reticle surfaces 206 will be engaged by notches 160 in resilient arms 143 when cover portion 140 is fully engaged with base portion 120. Reticle 200 is preferably placed with back surface 208 in contact with back positioning tabs 128, but may be placed so that back surface 208 is spaced apart from back positioning tabs 128. Latch tabs 146 are then pulled outwardly, and cover portion 140 is placed over base portion 120 as shown in FIG. 6. As cover portion 140 is moved downward as shown in FIG. 7, if back surface 208 is spaced apart from back positioning tabs 128, the diagonal leading edges 152 of self-positioning tabs 150 engage corner 210, which is formed by upper reticle surface 202 and front reticle surface 204. Corner 210 slides along diagonal leading edge 152 as cover portion 140 is moved downward as shown in FIGS. 7 and 8, causing reticle 200 to be urged toward back positioning tabs 128. When cover portion 140 is nearly fully engaged with base portion 120, corner 210 slides past corner 170 so that vertically oriented edge portion 172 is engaged with front surface 204 as shown in FIG. 9. When in this position, the reticle 200 is properly positioned so that corners 210 and 214 will be engaged by notches 160 in the resilient arms 143 corresponding to the front and back sides of the reticle 200, respectively. Cover portion 140 may then be fully engaged with base portion 120, placing mating surface 148 in contact with gasket 123. Latch tabs 146 may then be allowed to move inwardly, engaging latch recesses 130, thus sealingly securing cover portion 140 to base portion 120.

Of course, many alternative embodiments of the present self-positioning reticle carrier are possible and are within the scope of the invention, as will be appreciated by those of skill in the art. Such embodiments would include, but are not limited to, varying numbers and locations and configurations of positioning tabs.

Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples given.

The invention is:

1. A combination container for holding a workpiece associated with a semiconductor fabrication process, the workpiece including an upper surface, a lower surface, and an upper edge, the container comprising:

a base and a cover, the cover shaped and dimensioned to be progressively received into an engaged position with the base to define a sealed enclosure for housing the workpiece therein;

at least one support structure and at least one positioning member extending from the base, the support structure configured to contact and support the lower surface of the workpiece substantially horizontally relative to the base without contacting any other portion of the workpiece, and the positioning member shaped and positioned to limit lateral displacement of the workpiece from a desired position on the at least one support structure;

at least one positioning structure and at least one workpiece restraint affixed to the cover, the at least one positioning structure defining at least one sloping surface and the at least one workpiece restraint including at least one resilient arm, the positioning structure located to enable the sloping surface to correct a deviation of the workpiece from the desired position by engaging in sliding contact with the upper edge of the workpiece and slidingly urging the workpiece on the support structure towards the desired position as the cover is progressively received into the engaged position, the resilient arm arranged to exert a resilient bias on the upper surface to maintain the workpiece in the desired position within the sealed enclosure against movement relative to the at least one support structure.

2. The combination container of claim 1 wherein the at least one positioning structure includes a plurality of spaced apart tabs, each tab defining a portion of the sloping surface, wherein each tab is adapted to apply a force to the workpiece upon contact of the sloping surface portions with the upper edge of the workpiece.

3. The combination container of claim 1 wherein the workpiece comprises a reticle having a generally rectangular shape with a first and second pair of parallel upper edges, four upper corners and first and second pair of parallel side walls and the at least one positioning member comprises at least one back positioning tab located so as to abut a side wall of the reticle when the reticle is in the desired position within the sealed enclosure.

4. The combination container of claim 3 wherein the at least one positioning structure is located so as to urge the reticle into abutment with the at least one back positioning tab as the cover is progressively received into the engaged position.

5. The combination container of claim 1 wherein the at least one sloping surface of the positioning structure is positioned remote from the cover and the positioning structure further includes a vertical surface proximate the cover, the at least one sloping surface shaped to engage the upper edge of the workpiece as the cover is progressively received into the engaged position and the vertical surface shaped to abut a side surface of the workpiece when the workpiece is in the desired position within the sealed enclosure.

6. The combination container of claim 1 wherein the cover has a four sides and four corners and wherein workpiece restraints are attached to the cover proximate each of the four corners, each workpiece restraint having with a pair of angularly spaced resilient arms, each resilient arm adapted to exert a downwardly directed bias on the upper surface of the workpiece proximate an upper corner of the workpiece as the cover enters into the engaged position with the base.

7. The combination container of claim 6 wherein each resilient arm further includes a tip having a notch, each workpiece restraint located on the cover to allow the notches of each pair of resilient arms to engage and restrain an upper corner of the workpiece when the workpiece is in the desired position.

8. The container of claim 1 wherein the cover and the base are generally rectangular in shape with four sides and four corners and wherein the at least one support structure comprises spaced apart tabs fixedly attached to the base, each tab configured with at least one surface adapted for minimal contact with the lower surface of the workpiece.

9. The container of claim 1 wherein the cover is provided with at least one inwardly projecting latch tab and the base is provided with at least one recess corresponding to the at least one inwardly projecting latch tab, the recess shaped and located to receive the at least one inwardly projecting latch tab when the cover is in the engaged position with the base whereby the cover is removably latched to the base.

10. A container for housing a reticle, the reticle having an upper surface, an opposed lower surface, corners, lateral side walls extending between corners and upper peripheral edges intermediate the upper surface and the lateral side walls, the container comprising a base with a first interior surface and a cover with a second interior surface, the cover adapted to be removably engaged with the base to form an isolating enclosure bounded at least in part by the first and second interior surfaces and capable of housing the reticle therein, the container further comprising:

a plurality of support structures secured to the base and extending substantially vertically from the first interior surface, each of the plurality of support structures adapted to engage and support the lower surface of the reticle in substantially horizontal alignment with the base without contacting any other portion of the reticle, and at least one positioning structure constructed and arranged to engage and locate a lateral side wall of the reticle; and a plurality of locating structures fixedly affixed to the cover, each locating structure having a cam surface for contacting the reticle at a predetermined location and slidingly urging the reticle on the support structures towards a central portion of the isolated enclosure as the cover approaches the base so that the reticle is located in a desired position relative to the base when the cover is completely engaged with the base.

11. The container of claim 10 wherein the cover is provided with at least one reticle restraint removably attached to the cover, each reticle restraint provided with a pair of angularly spaced resilient arms, each resilient arm adapted to exert a downwardly directed bias on the upper surface of the reticle proximate an upper corner of the reticle as the cover is completely engaged with the base.

12. A method for supporting a reticle in a container, the reticle having an upper surface, an opposed lower surface, corners, lateral side walls extending between corners and upper peripheral edges intermediate the upper surface and the lateral side walls, the method comprising:

providing a container comprising a base with a plurality of support structures; and a cover with a plurality of locating structures, each locating structure having a cam surface;

placing the reticle on the plurality of support structures such that the lower surface of the reticle rests on the support structures and no other portion of the reticle is in contact with the support structures;

placing the cam surface of at least one of the plurality of locating structures in contact with the upper peripheral edge of the reticle by progressively approaching the base with the cover; and slidingly urging the reticle into the desired position relative to the base by engaging the cover with the base.

13. An apparatus for supporting a reticle within an isolation enclosure formed by mating a cover to a base, the apparatus comprising:

a support structure extending from the base for contactingly supporting a lower surface of the reticle, the support structure otherwise free from contact with the reticle;

means for locating a side wall of the reticle relative to the base;

means located on the cover for progressively slidingly urging the reticle on the support structure towards a desired position relative to the base; and means located on the cover for preventing movement of the reticle relative to the base after the reticle is located in the desired position.

14. The apparatus of claim 13 further including:

a latch means located on the cover; and a recess means corresponding to the latch means, the recess means located on the base for receiving the latch means to removable secure the cover to the base.

15. The apparatus of claim 13 wherein the means for locating the side wall of the reticle includes:

means for limiting a displacement of the first and second parallel side walls of the reticle relative to the desired position; and means for locating a third side wall of the reticle relative to the desired position wherein the third side wall is substantially perpendicular to the first and second side walls.

16. The apparatus of claim 13 wherein the means located on the cover for preventing movement of the reticle relative to the base after the reticle is located in the desired position includes:

means for applying a downwardly directed bias on at least a portion of the upper surface of the reticle; and means for restraining at least one of the upper peripheral edges against movement relative to the base.

* * * * *

UNITED STATES PATENT AND TRADEMARK OFFICE
CERTIFICATE OF CORRECTION

PATENT NO.         : 7,139,066 B2
APPLICATION NO. : 10/999371
DATED              : November 21, 2006
INVENTOR(S)        : Brian Wiseman and Justin Strike It is certified that error appears in the above-identified patent and that said Letters Patent is hereby corrected as shown below:

Column 3, Line 43, the word "silent" should be replaced with the word --resilien--
Column 3, Line 38, "en" should be replaced with --an--
Column 5, Line 48, the letter "a" should be removed from the sentence
Column 5, Line 50, the word "with" should be removed from the sentence
Column 7, Line 17, the word "removable" should be replaced with --removably--

Signed and Sealed this

First Day of July, 2008

JON W. DUDAS
*Director of the United States Patent and Trademark Office*